US012278566B2

(12) United States Patent
Zhong

(10) Patent No.: US 12,278,566 B2
(45) Date of Patent: Apr. 15, 2025

(54) PREPROCESSING CIRCUIT FOR COMPARATORS AND PREPROCESSING METHOD THEREOF

(71) Applicant: Chengdu Monolithic Power Systems Co., Ltd., Chengdu (CN)

(72) Inventor: Changxian Zhong, Chengdu (CN)

(73) Assignee: Chengdu Monolithic Power Systems Co., Ltd., Sichuan (CN)

( * ) Notice: Subject to any disclaimer, the term of this patent is extended or adjusted under 35 U.S.C. 154(b) by 77 days.

(21) Appl. No.: 18/174,301

(22) Filed: Feb. 24, 2023

(65) Prior Publication Data

US 2023/0216415 A1 Jul. 6, 2023

(30) Foreign Application Priority Data

Mar. 9, 2022 (CN) .......................... 202210224229.8

(51) Int. Cl.
*H02M 3/158* (2006.01)
*H03K 5/24* (2006.01)

(52) U.S. Cl.
CPC ........ *H02M 3/1584* (2013.01); *H03K 5/2481* (2013.01)

(58) Field of Classification Search
CPC ..... H02M 3/1584; H03K 5/2481; H03K 5/08; H03K 5/24; H03K 5/2472; H03K 5/2418; H03K 5/2445; G11C 7/062; G01R 19/0038
See application file for complete search history.

(56) References Cited

U.S. PATENT DOCUMENTS

| | | | |
|---|---|---|---|
| 10,020,734 B2 | 7/2018 | Zhong | |
| 11,343,886 B2 | 5/2022 | Ding et al. | |
| 2003/0071672 A1* | 4/2003 | Abe | H03M 1/1295 327/321 |
| 2022/0146576 A1 | 5/2022 | Zhong | |

* cited by examiner

*Primary Examiner* — Jung Kim
(74) *Attorney, Agent, or Firm* — Perkins Coie LLP

(57) ABSTRACT

A preprocessing circuit for a comparator has a high voltage selection circuit, a first constant voltage circuit, a second constant voltage circuit, a first transistor, and a second transistor. The high voltage selection circuit receives a first voltage and a second voltage, and provides a selected voltage. The first constant voltage circuit provides a first clamping voltage based on the selected voltage, and the second constant voltage circuit provides a second clamping voltage based on the selected voltage. The first transistor receives the first voltage and the first clamping voltage, and provides a first comparison voltage to a first comparison terminal of the comparator. The second transistor receives the second voltage and the second clamping voltage, and provides a second comparison voltage to a second comparison terminal of the comparator.

11 Claims, 4 Drawing Sheets

PREPROCESSING CIRCUIT FOR COMPARATORS AND PREPROCESSING METHOD THEREOF

CROSS-REFERENCE TO RELATED APPLICATIONS

This application claims the benefit of CN application 202210224229.8, filed on Mar. 9, 2022, and incorporated herein by reference.

BACKGROUND OF THE INVENTION

1. Field of the Invention

The present invention generally relates to comparison circuits, and more particularly, relates to preprocessing circuits for comparators.

2. Description of Related Art

Comparison circuits are widely used in various circuit structures, for they can provide an indication signal by comparing a first voltage with a second voltage. Currently, ranges of the first voltage and the second voltage processed by the comparison circuits are constantly increasing. As a result, a differential-mode voltage of the first voltage and the second voltage also has an increasing range.

Thus, if the differential-mode voltage of the first voltage and the second voltage exceeds a differential-mode range that a comparator can process, then it is necessary to preprocess the first voltage and the second voltage to limit the differential-mode voltage of the first voltage and the second voltage within the differential-mode range of the comparator. Traditionally, a resistor divider is used to proportionally scale down the first voltage and the second voltage, such that the differential-mode voltage of the first voltage and the second voltage is reduced. However, using the resistor divider will introduce an extra voltage error due to resistor errors, and an error of the comparator is also proportionally added to the first voltage and the second voltage, such that the accuracy of comparing the first voltage with the second voltage is reduced.

Therefore, a preprocessing circuit for a comparator is in high demand to limit the differential-mode voltage of the first voltage and the second voltage within the differential-mode range of the comparator, without sacrificing the accuracy of comparing the first voltage with the second voltage.

SUMMARY OF THE INVENTION

Embodiments of the present invention are directed to a preprocessing circuit for a comparator, comprising a high voltage selection circuit, a first constant voltage circuit, a second constant voltage circuit, a first transistor, and a second transistor. The comparator has a first comparison terminal and a second comparison terminal. The high voltage selection circuit comprises a first input terminal to receive a first voltage, a second input terminal to receive a second voltage, and an output terminal to provide a selected voltage based on the first voltage and the second voltage. The first constant voltage circuit comprises a first terminal and a second terminal, wherein the first terminal is coupled to the output terminal of the high voltage selection circuit, and the second terminal is configured to provide a first clamping voltage based on the selected voltage. The second constant voltage circuit comprises a first terminal and a second terminal, wherein the first terminal is coupled to the output terminal of the high voltage selection circuit, and the second terminal is configured to provide a second clamping voltage based on the selected voltage. The first transistor comprises a first terminal to receive the first voltage, a second terminal to receive the first clamping voltage, and a third terminal to provide a first comparison voltage to the first comparison terminal of the comparator. The second transistor comprises a first terminal to receive the second voltage, a second terminal to receive the second clamping voltage, and a third terminal to provide a second comparison voltage to the second comparison terminal of the comparator.

Embodiments of the present invention are directed to a preprocessing circuit for a comparator. The comparator has a first comparison terminal and a second comparison terminal. The preprocessing circuit comprises a first input terminal, a second input terminal, a first output terminal and a second output terminal. The first input terminal is configured to receive a first voltage, the second input terminal is configured to receive a second voltage, the first output terminal is configured to provide a first comparison voltage to the first comparison terminal, and the second output terminal is configured to provide a second comparison voltage to the second comparison terminal. When the first voltage is larger than the second voltage and a difference between the first voltage and the second voltage is larger than a first reference voltage, the first comparison voltage is equal to the first voltage, and the second comparison voltage is equal to the first voltage minus the first reference voltage. When the first voltage is larger than the second voltage and the difference between the first voltage and the second voltage is smaller than the first reference voltage, the first comparison voltage is equal to the first voltage, and the second comparison voltage is equal to the second voltage. When the first voltage is smaller than the second voltage and the difference between the first voltage and the second voltage is smaller than a second reference voltage, the first comparison voltage is equal to the first voltage, and the second comparison voltage is equal to the second voltage. When the first voltage is smaller than the second voltage and the difference between the first voltage and the second voltage is larger than the second reference voltage, the first comparison voltage is equal to the second voltage minus the second reference voltage, and the second comparison voltage is equal to the second voltage.

Embodiments of the present invention are directed to a preprocessing method for a comparator. The comparator has a first comparison terminal and a second comparison terminal. The preprocessing method comprises receiving a first voltage and a second voltage, providing a first comparison voltage to the first comparison terminal based on the first voltage, the second voltage, and a first reference voltage, and providing a second comparison voltage to the second comparison terminal based on the first voltage, the second voltage, and a second reference voltage, wherein when the first voltage is larger than the second voltage and a difference between the first voltage and the second voltage is larger than the second reference voltage, the first comparison voltage is equal to the first voltage, and the second comparison voltage is equal to the first voltage minus the second reference voltage. When the first voltage is larger than the second voltage and the difference between the first voltage and the second voltage is smaller than the first reference voltage, the first comparison voltage is equal to the first voltage, and the second comparison voltage is equal to the second voltage. When the first voltage is smaller than the second voltage and the difference between the first voltage and the second voltage is smaller than a second reference voltage, the first comparison voltage is equal to the first voltage, and the second comparison voltage is equal to the second voltage. When the first voltage is smaller than the first voltage and the difference between the first voltage and the second voltage is larger than the second reference voltage, the first comparison voltage is equal to the second voltage minus the first reference voltage, and the second comparison voltage is equal to the second voltage.

These and other features of the present invention will be readily apparent to persons of ordinary skill in the art upon reading the entirety of this disclosure, which includes the accompanying drawings and claims.

BRIEF DESCRIPTION OF DRAWINGS

The present invention can be further understood with reference to the following detailed description and the appended drawings, wherein like elements are provided with like reference numerals.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
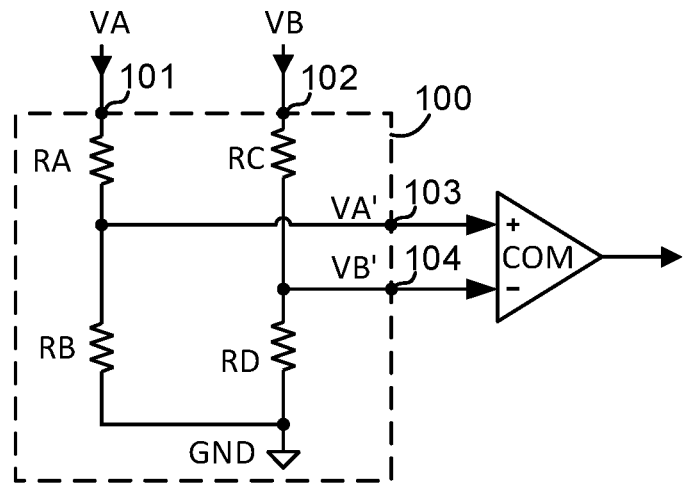
FIG. 1 shows a prior art comparator COM with a preprocessing circuit 100.

FIG. 1 shows a prior art comparison circuit comprising a comparator COM and a preprocessing circuit 100. In FIG. 1, a differential-mode voltage of a voltage VA and a voltage VB (i.e. a difference between the voltage VA and the voltage VB) exceeds a differential-mode range of the comparator COM, therefore, the preprocessing circuit 100 is employed to scale down the voltage VA and the voltage VB proportionally, such that a differential-mode voltage of a comparison voltage VA' and a comparison voltage VB' is limited within the differential-mode range of the comparator COM, wherein the comparison voltage VA' is received by a first comparison terminal of the comparator COM, and the comparison voltage VB' is received by a second comparison terminal of the comparator COM. As shown in FIG. 1, the preprocessing circuit 100 has a first input terminal 101 to receive the voltage VA, a second input terminal 102 to receive the voltage VB, a first output terminal 103 to provide the comparison voltage VA', and a second output terminal 104 to provide the comparison voltage VB'. The preprocessing circuit 100 comprises resistors RA, RB, RC and RD. The resistors RA and RB are coupled in series between the first input terminal 101 of the preprocessing circuit 100 and a reference ground GND. The resistors RC and RD are coupled in series between the second input terminal 102 of the preprocessing circuit 100 and the reference ground GND. By setting the resistance of the resistor RA equal to the resistance of the resistor RB and setting the resistance of the resistor RC equal to the resistance of the resistor RD, the voltage VA and the voltage VB are proportionally scaled down, such that the differential-mode voltage of the voltage VA and the voltage VB is reduced to be within the differential-mode range of the comparator COM. However, extra errors are introduced by the resistors RA, RB, RC and RD in this method, which reduces the accuracy of comparing the voltage VA with the voltage VB.

Figure 2:
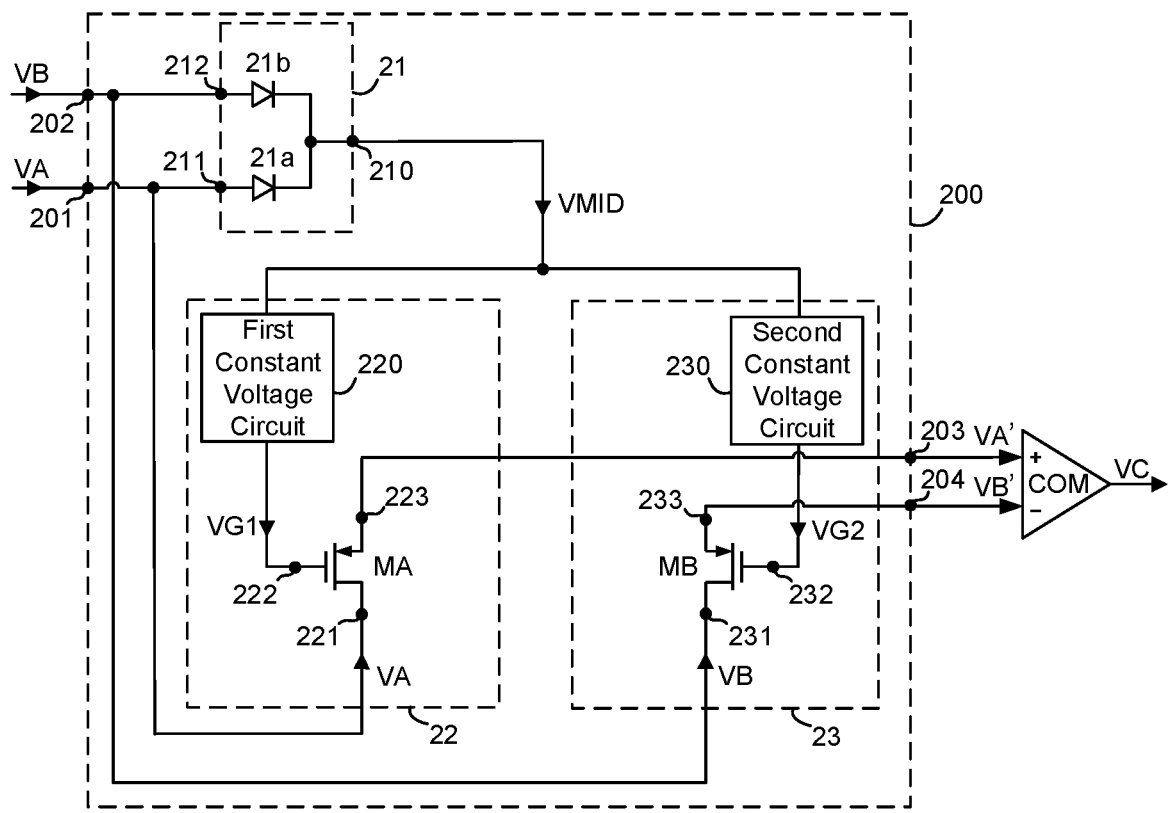
FIG. 2 schematically shows a preprocessing circuit 200 and a comparator COM in accordance with an embodiment of the present invention.

FIG. 2 schematically shows a preprocessing circuit 200 and a comparator COM in accordance with an embodiment of the present invention. As shown in FIG. 2, the preprocessing circuit 200 has a first input terminal 201 to receive the voltage VA, a second input terminal 202 to receive the second voltage VB, a first output terminal 203 to provide the comparison voltage VA', and a second output terminal 204 to provide the comparison voltage VB'. When the voltage VA is larger than the voltage VB and the difference between the voltage VA and the voltage VB is larger than a reference voltage VREF1, the comparison voltage VA' equals the voltage VA, and the comparison voltage VB' is clamped to (VA-VREF1), i.e., the comparison voltage VB' is equal to the voltage VA minus the reference voltage VREF1. When the voltage VA is larger than the voltage VB and the difference between the voltage VA and the voltage VB is smaller than the reference voltage VREF1, then the comparison voltage VA' equals the voltage VA, and the comparison voltage VB' equals the voltage VB. When the voltage VA is smaller than the voltage VB and the difference between the voltage VA and the voltage VB is smaller than a reference voltage VREF2, the comparison voltage VA' equals the voltage VA, and the comparison voltage VB' equals the voltage VB. When the voltage VA is smaller than the voltage VB and the difference between the voltage VA and the voltage VB is larger than the reference voltage VREF2, the comparison voltage VA' equals the voltage VB minus the reference voltage VREF2, and the comparison voltage VB' equals the voltage VB. In one embodiment, the reference voltage VREF1 is equal to the reference voltage VREF2. In one embodiment, the reference voltages VREF1 and VREF2 are set according to the differential-mode range of the comparator COM. In another embodiment, the reference voltages VREF1 and VREF2 are within the differential-mode range of the comparator COM.

Still referring to FIG. 2, the preprocessing circuit 200 comprises a high voltage selection circuit 21, a clamping circuit 22, and a clamping circuit 23. The high voltage selection circuit 21 has a first input terminal 211 to receive the voltage VA, a second input terminal 212 to receive the voltage VB, and an output terminal 210 to provide a selected voltage VMID. The selected voltage VMID is equal to the voltage VA when the voltage VA is larger than the voltage VB, and is equal to the voltage VB when the voltage VA is smaller than the voltage VB. In the example of FIG. 2, the high voltage selection circuit 21 comprises a diode 21a and a diode 21b, and each of the diode 21a and the diode 21b has an anode and a cathode. The anode of the diode 21a receives the voltage VA, the anode of the diode 21b receives the voltage VB, and the cathode of the diode 21a and the cathode of the diode 21b are coupled together to provide the selected voltage VMID at the output terminal 210 of the high voltage selection circuit. It should be understood that the selected voltage VMID may not be strictly equal to the voltage VA or the voltage VB. In some embodiments, the selected voltage VMID may be equal to the voltage VA minus a preset voltage or the voltage VB minus a preset voltage. And in the example of FIG. 2, the selected voltage VMID is equal to the voltage VA minus a forward voltage of the diode 21a or the voltage VB minus a forward voltage of the diode 21b. The clamping circuit 22 has a first input terminal to receive the voltage VA, a second input terminal to receive the selected voltage VMID, and an output terminal 210 coupled to the first comparison terminal of the comparator COM to provide the comparison voltage VA'. The clamping circuit 23 has a first input terminal to receive the voltage VB, a second input terminal to receive the selected voltage VMID, and an output terminal coupled to the second comparison terminal of the comparator COM to provide the comparison voltage VB'.

Still referring to FIG. 2, the clamping circuit 22 comprises a first constant voltage circuit 220 and a transistor MA. The first constant voltage circuit 220 has a first terminal coupled to the output terminal 210 of the high voltage selection circuit 21, and a second terminal to provide a clamping voltage VG1, wherein the clamping voltage VG1 is smaller than the selected voltage VMID. A difference between the clamping voltage VG1 and the selected voltage VMID is defined as a base voltage V1. The transistor MA comprises a first terminal 221 to receive the voltage VA, a second terminal 222 to receive the clamping voltage VG1, and a third terminal 223 to provide the comparison voltage VA'. The transistor MA has a threshold voltage VTH1, and the constant voltage V1 is equal to a sum of the reference voltage VREF1 and the threshold voltage VTH1. The clamping circuit 23 comprises a second constant voltage circuit 230 and a transistor MB. The second constant voltage circuit 230 has a first terminal coupled to the output terminal 210 of the high voltage selection circuit 21, and a second terminal to provide a clamping voltage VG2, wherein the clamping voltage VG2 is smaller than the selected voltage VMID. A difference between the clamping voltage VG2 and the selected voltage VMID is defined as a base voltage V2. The transistor MB comprises a first terminal 231 to receive the voltage VB, a second terminal 232 to receive the clamping voltage VG2, and a third terminal 233 to provide the comparison voltage VB'. The transistor MB has a threshold voltage VTH2, and the constant voltage V2 is equal to a sum of the reference voltage VREF2 and the threshold voltage VTH2. In the example of FIG. 2, the transistor MA and MB are metal-oxide-semiconductor field effect transistors (MOSFETs), the threshold voltage VTH1 refers to a minimum voltage between a gate and a source of the transistor MA that is needed to turn on the transistor MA, and the threshold voltage VTH2 refers to a minimum voltage between a gate and a source of the transistor MB that is needed to turn on the transistor MB. The threshold voltages VTH1 and VTH2 are usually around 0.7V for P-channel MOSFETs (PMOSs), In the example of FIG. 2, the comparator COM is a differential comparator. The comparator COM provides an indication signal VC based on the comparison voltage VA' and the comparison voltage VB'. When the comparison voltage VA' is larger than the comparison voltage VB', the indication signal VC is logic high, and when the comparison voltage VA' is smaller than the comparison voltage VB', the indication signal VC is logic low. In some examples, a voltage level between a high threshold voltage (e.g., 2V) and a voltage source VCC (e.g., 3.3V) is considered as logic high ("1"), a voltage level between zero voltage (0 V) and a low threshold voltage (e.g., 1V) is considered as logic low ("0").

Figure 3:
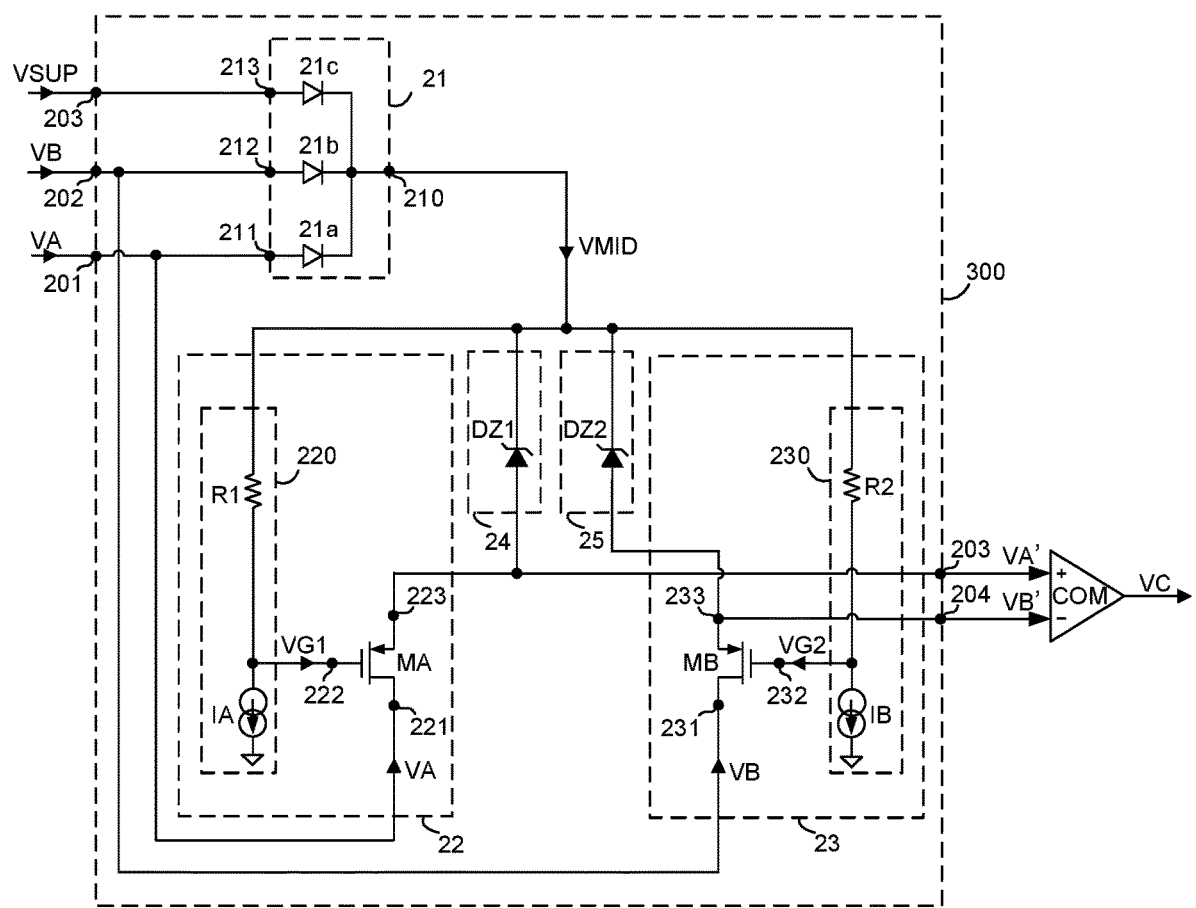
FIG. 3 schematically shows a preprocessing circuit 300 and the comparator COM in accordance with another embodiment of the present invention.

FIG. 3 schematically shows a preprocessing circuit 300 and the comparator COM in accordance with another embodiment of the present invention. Compared with the preprocessing circuit 200 shown in FIG. 2, the preprocessing circuit 300 further comprises a protection circuit 24 and a protection circuit 25. The protection circuit 24 is coupled between the output terminal 210 of the high voltage selection circuit 21 and the first comparison terminal of the comparator COM. The protection circuit 24 clamps the comparison voltage VA' to make a difference between the comparison voltage VA' and the clamping voltage VG1 smaller than the breakdown voltage of the transistor MA. In the example of FIG. 3, the transistor MA is a PMOS, and the breakdown voltage of the transistor MA refers to the breakdown voltage between a gate and a source of a PMOS. The protection circuit 25 is coupled between the output terminal 210 of the high voltage selection circuit 21 and the second comparison terminal of the comparator COM. The protection circuit 25 clamps the comparison voltage VB' to make a difference between the comparison voltage VB' and the clamping voltage VG1 smaller than the breakdown voltage of the transistor MB. In the example of FIG. 3, the transistor MB is a PMOS, and the breakdown voltage of the transistor MB refers to the breakdown voltage between a drain and a source of a PMOS. In the example of FIG. 3, the protection circuit 24 comprises a Zener diode DZ1, and the protection circuit 25 comprises a Zener diode DZ2.

Still referring to FIG. 3, compared with the preprocessing circuit 200 shown in FIG. 2, the high voltage selection circuit 21 of the preprocessing circuit 300 further comprises a third input terminal 213 to receive a supply voltage VSUP. When the supply voltage VSUP is larger than the voltage VA and is larger than the voltage VB, the selected voltage VMID is equal to the supply voltage VSUP. It should be understood that the selected voltage VMID may not be strictly equal to the supply voltage VSUP. In some embodiments, the selected voltage VMID may be equal to the supply voltage VSUP minus a preset voltage. In the embodiment of FIG. 3, the high voltage selection circuit 21 further comprises a diode 21c. The diode 21c is coupled between the third input terminal of the high voltage selection circuit 21 and the output terminal 210 of the high voltage selection circuit 21. As shown in FIG. 3, the first constant voltage circuit 220 comprises a resistor R1 and a current source IA, and the second constant voltage circuit 230 comprises a resistor R2 and a current source IB. The resistor R1 is coupled between the output terminal 210 of the high voltage selection circuit 21 and the second terminal 222 of the transistor MA, and the current source IA is coupled between the second terminal 222 of the transistor MA and a reference ground. The resistor R2 is coupled between the output terminal 210 of the high voltage selection circuit 21 and the second terminal 232 of the transistor MB, and the current source IB is coupled between the second terminal 232 of the transistor MB and the reference ground. One with ordinary skill in the art should understand that the detailed circuit structure of the preprocessing circuit 300 is not limited by the example shown in FIG. 3, and may comprise any other suitable circuit structures which are not departed from the spirit and the scope of the present invention.

Figure 4:
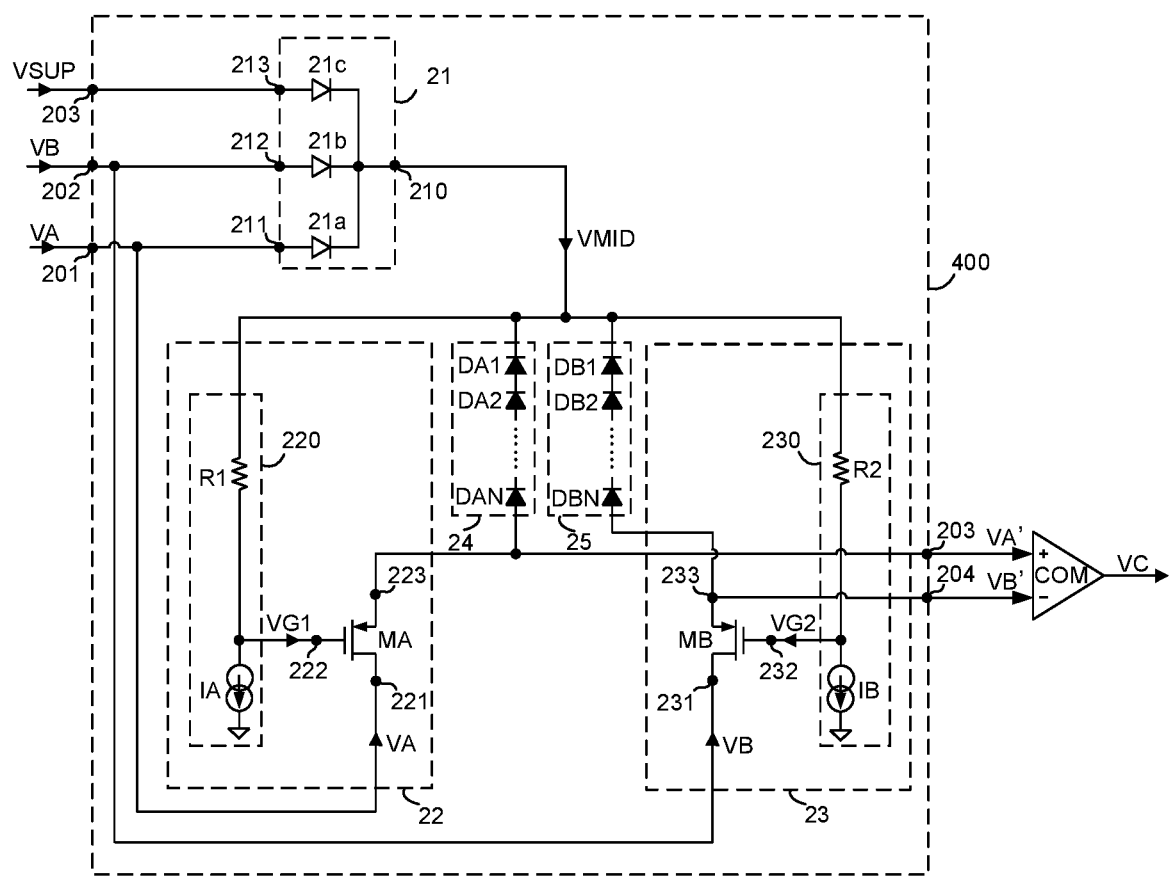
FIG. 4 schematically shows a preprocessing circuit 400 and the comparator COM in accordance with another embodiment of the present invention.

FIG. 4 schematically shows a preprocessing circuit 400 and the comparator COM in accordance with another embodiment of the present invention. Compared with the preprocessing circuit 300 shown in FIG. 3, the protection circuit 24 of the preprocessing circuit 400 comprises a plurality of diodes DA1-DAN coupled in series, and the protection circuit 25 of the preprocessing circuit 400 comprises a plurality of diodes DB1-DBN coupled in series, wherein N is a natural number greater than or equal to 1.

Figure 5:
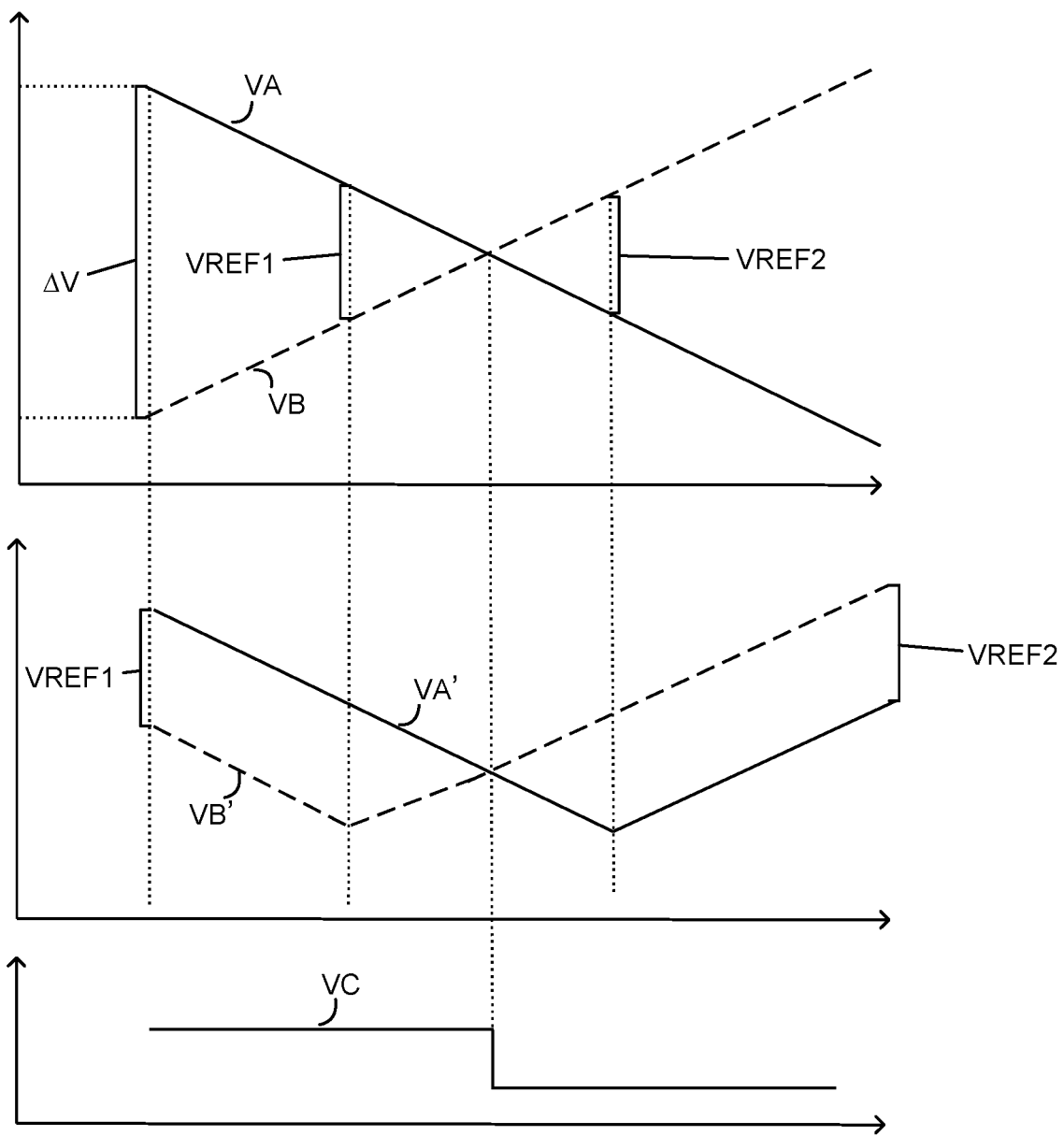
FIG. 5 shows waveforms of signals of a preprocessing circuit in accordance with an embodiment of the present invention.

FIG. 5 shows waveforms of signals of a preprocessing circuit in accordance with an embodiment of the present invention. FIG. 5 shows waveforms of the voltage VA, the voltage VB, the comparison voltage VA', the comparison voltage VB', and the indication signal VC. The difference between voltage VA and the voltage VB is marked as ΔV. The voltage VA and the comparison voltage VA' are marked with solid lines, and the voltage VB and the comparison voltage VB' are marked with dashed lines. The waveforms shown in FIG. 5 are described with reference to the preprocessing circuit 300 for illustration. As shown in FIG. 5, when the voltage VA is larger than the voltage VB and the difference between the voltage VA and the voltage VB is larger than the reference voltage VREF1, the comparison voltage VA' is equal to the voltage VA, the comparison voltage VB' is clamped to (VA-VREF1), i.e., the comparison voltage VB' is equal to the voltage VA minus the reference voltage VREF1, and the indication signal VC is logic high. When the voltage VA is larger than the voltage VB and the difference between the voltage VA and the voltage VB is smaller than the reference voltage VREF1, the comparison voltage VA' is equal to the voltage VA, the comparison voltage VB' is equal to the voltage VB, and the indication signal VC is logic high. When the voltage VA is smaller than the voltage VB and the difference between the voltage VA and the voltage VB is smaller than the reference voltage VREF2, the comparison voltage VA' is equal to the voltage VA, the comparison voltage VB' is equal to the voltage VB, and the indication signal VC is logic low. When the voltage VA is smaller than the voltage VB and the difference between the voltage VA and the voltage VB is larger than the reference voltage VREF2, the comparison voltage VA' is equal to the voltage VB minus the reference voltage VREF2, the comparison voltage VB' is equal to the voltage VB, and the indication signal VC is logic low.

When the difference between the voltage VA and the voltage VB exceeds the differential-mode range of the comparator COM, the preprocessing circuit of the present invention can be used to limit the difference between the voltage VA and the voltage VB within the differential-mode range of the comparator COM without reducing the accuracy of comparing the voltage VA and the voltage VB.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

The invention claimed is:

1. A preprocessing circuit for a comparator, the comparator having a first comparison terminal and a second comparison terminal, the preprocessing circuit comprising:
   a first input terminal, configured to receive a first voltage;
   a second input terminal, configured to receive a second voltage;
   a first output terminal, configured to provide a first comparison voltage to the first comparison terminal; and
   a second output terminal, configured to provide a second comparison voltage to the second comparison terminal;
   wherein
   when the first voltage is larger than the second voltage and a difference between the first voltage and the second voltage is larger than a first reference voltage, the first comparison voltage is equal to the first voltage, and the second comparison voltage is equal to the first voltage minus the first reference voltage; and wherein
   when the first voltage is larger than the second voltage and the difference between the first voltage and the second voltage is smaller than the first reference voltage, the first comparison voltage is equal to the first voltage, and the second comparison voltage is equal to the second voltage; and wherein
   when the first voltage is smaller than the second voltage and the difference between the first voltage and the second voltage is smaller than a second reference voltage, the first comparison voltage is equal to the first voltage, and the second comparison voltage is equal to the second voltage; and wherein
   when the first voltage is smaller than the second voltage and the difference between the first voltage and the second voltage is larger than the second reference voltage, the first comparison voltage is equal to the second voltage minus the second reference voltage, and the second comparison voltage is equal to the second voltage.

2. The preprocessing circuit of claim 1, wherein the first reference voltage is equal to the second reference voltage.

3. The preprocessing circuit of claim 1, wherein the first reference voltage and the second reference voltage are smaller than a maximum differential-mode voltage that the comparator can process.

4. The preprocessing circuit of claim 1, further comprising:
   a high voltage selection circuit, having a first input terminal to receive the first voltage, a second input terminal to receive the second voltage, and an output terminal to provide a selected voltage, wherein the selected voltage is equal to the first voltage in response to the first voltage being larger than the second voltage, and is equal to the second voltage in response to the first voltage being smaller than the second voltage;
   a first clamping circuit, having a first input terminal to receive the first voltage, a second input terminal to receive the selected voltage, and an output terminal coupled to the first comparison terminal to provide the first comparison voltage; and
   a second clamping circuit, having a first input terminal to receive the second voltage, a second input terminal to receive the selected voltage, and an output terminal coupled to the second comparison terminal to provide the second comparison voltage.

5. The preprocessing circuit of claim 4, wherein the high voltage selection circuit comprises:
a first diode, having an anode to receive the first voltage, and a cathode; and
a second diode, having an anode to receive the second voltage, and a cathode; wherein
the cathode of the first diode and the cathode of the second diode are coupled together to provide the selected voltage.

6. The preprocessing circuit of claim 4, wherein:
the first clamping circuit comprises:
a first constant voltage circuit, configured to provide a first clamping voltage based on the selected voltage; and
a first transistor, having a first terminal to receive the first voltage, a second terminal to receive the first clamping voltage, and a third terminal to provide the first comparison voltage, wherein the first transistor has a first threshold voltage, and the first clamping voltage is equal to the selected voltage minus a sum of the second reference voltage and the first threshold voltage; and wherein
the second clamping circuit comprises:
a second constant voltage circuit, configured to provide a second clamping voltage based on the selected voltage; and
a second transistor, having a first terminal to receive the second voltage, a second terminal to receive the second clamping voltage, and a third terminal to provide the second comparison voltage, wherein the second transistor has a second threshold voltage, and the second clamping voltage is equal to the selected voltage minus a sum of the first reference voltage and the second threshold voltage.

7. The preprocessing circuit of claim 4, further comprising:
a first protection circuit, coupled between the output terminal of the high voltage selection circuit and the first comparison terminal of the comparator, wherein the first protection circuit is configured to clamp the first comparison voltage; and
a second protection circuit, coupled between the output terminal of the high voltage selection circuit and the second comparison terminal of the comparator, wherein the second protection circuit is configured to clamp the second comparison voltage.

8. A preprocessing method for a comparator, the comparator having a first comparison terminal and a second comparison terminal, the preprocessing method comprising:
receiving a first voltage and a second voltage;
providing a first comparison voltage to the first comparison terminal based on the first voltage, the second voltage, and a first reference voltage; and
providing a second comparison voltage to the second comparison terminal based on the first voltage, the second voltage, and a second reference voltage; wherein when the first voltage is larger than the second voltage and a difference between the first voltage and the second voltage is larger than the second reference voltage, the first comparison voltage is equal to the first voltage, and the second comparison voltage is equal to the first voltage minus the second reference voltage; and wherein
when the first voltage is larger than the second voltage and the difference between the first voltage and the second voltage is smaller than the first reference voltage, the first comparison voltage is equal to the first voltage, and the second comparison voltage is equal to the second voltage; and wherein
when the first voltage is smaller than the second voltage and the difference between the first voltage and the second voltage is smaller than a second reference voltage, the first comparison voltage is equal to the first voltage, and the second comparison voltage is equal to the second voltage; and wherein
when the first voltage is smaller than the second voltage and the difference between the first voltage and the second voltage is larger than the first reference voltage, the first comparison voltage is equal to the second voltage minus the first reference voltage, and the second comparison voltage is equal to the second voltage.

9. The preprocessing method of claim 8, wherein providing the first comparison voltage to the first comparison terminal based on the first voltage, the second voltage, and the first reference voltage further comprises:
providing a selected voltage based on the first voltage and the second voltage, wherein the selected voltage is equal to the first voltage when the first voltage is larger than the second voltage, and is equal to the second voltage when the first voltage is smaller than the second voltage;
providing a first clamping voltage based on the selected voltage and the first reference voltage; and
providing the first comparison voltage to the first comparison terminal based on the first clamping voltage and the first voltage.

10. The preprocessing method of claim 8, wherein providing the second comparison voltage to the second comparison terminal based on the first voltage, the second voltage, and the second reference voltage further comprises:
providing a selected voltage based on the first voltage and the second voltage, wherein the selected voltage is equal to the first voltage when the first voltage is larger than the second voltage, and is equal to the second voltage when the first voltage is smaller than the second voltage;
providing a second clamping voltage based on the selected voltage and the second reference voltage; and
providing the second comparison voltage to the second comparison terminal based on the second clamping voltage and the second voltage.

11. The preprocessing method of claim 8, wherein the first reference voltage and the second reference voltage are smaller than a maximum differential-mode voltage that the comparator can process.

* * * * *